(12) United States Patent
Asakawa

(10) Patent No.: US 10,026,930 B2
(45) Date of Patent: Jul. 17, 2018

(54) METHOD OF MANUFACTURING DISPLAY APPARATUS

(71) Applicant: SAMSUNG DISPLAY CO., LTD., Yongin, Gyeonggi-Do (KR)

(72) Inventor: Yukinori Asakawa, Yongin (JP)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 586 days.

(21) Appl. No.: 14/685,981

(22) Filed: Apr. 14, 2015

(65) Prior Publication Data

US 2016/0114522 A1    Apr. 28, 2016

(30) Foreign Application Priority Data

Oct. 27, 2014 (KR) .................. 10-2014-0146422

(51) Int. Cl.
| | | |
|---|---|---|
| B29C 59/16 | (2006.01) |
| H01L 51/56 | (2006.01) |
| H01L 51/00 | (2006.01) |
| B23K 26/06 | (2014.01) |
| B23K 26/067 | (2006.01) |
| B23K 26/361 | (2014.01) |

(52) U.S. Cl.
CPC .......... *H01L 51/56* (2013.01); *B23K 26/0608* (2013.01); *B23K 26/0676* (2013.01); *B23K 26/361* (2015.10); *B29C 59/16* (2013.01); *H01L 51/003* (2013.01)

(58) Field of Classification Search
CPC ... H01L 51/003; H01L 51/56; H01L 51/5048; H01L 51/0016; B23K 26/0608; B23K 26/0676; B23K 26/06; B23K 26/0604; B23K 26/0619; B23K 26/50; B23K 26/57; B23K 26/36; B23K 26/361
USPC ........................................................ 264/400
See application file for complete search history.

(56) References Cited

U.S. PATENT DOCUMENTS

| 7,538,948 B2 | 5/2009 | Muenz et al. |
| 7,864,429 B2 | 1/2011 | Muenz et al. |

(Continued)

FOREIGN PATENT DOCUMENTS

| JP | 2000-338447 A | 12/2000 |
| JP | 2007-512708 A | 5/2007 |

(Continued)

OTHER PUBLICATIONS

Tatsuki Okamoto et al., "Development of Line-Shaped Optical System for Green Laser Annealing Used in the Manufacture of Low-Temperature Poly-Si Thin-Film Transistors", Applied Optics, vol. 45, No. 19, pp. 4709-4714.

*Primary Examiner* — Matthew J Daniels
*Assistant Examiner* — Lawrence D. Hohenbrink, Jr.
(74) *Attorney, Agent, or Firm* — Lee & Morse, P.C.

(57) ABSTRACT

A method of manufacturing a display apparatus includes forming a flexible substrate on a first surface of a carrier substrate, forming a display device on the flexible substrate, and ablating the carrier substrate by radiating a plurality of laser beams on a second surface of the carrier substrate, the second surface being opposite the first surface, such that the plurality of laser beams is incident on the second surface at different angles, passes through the carrier substrate, and is overlappingly focused on a first region of a boundary surface between the carrier substrate and the flexible substrate.

13 Claims, 15 Drawing Sheets

(56) References Cited

U.S. PATENT DOCUMENTS

| | | |
|---|---|---|
| 2006/0209310 A1 | 9/2006 | Muenz et al. |
| 2007/0000428 A1 | 1/2007 | Yamazaki et al. |
| 2011/0132549 A1* | 6/2011 | Sercel ................ B32B 38/0008 156/712 |
| 2012/0258605 A1* | 10/2012 | Wagner .............. B23K 26/0608 438/795 |
| 2013/0128910 A1 | 5/2013 | Matsuda et al. |
| 2015/0179520 A1* | 6/2015 | Sadaka .............. H01L 21/7813 438/463 |
| 2016/0023305 A1* | 1/2016 | Shi .................... B23K 26/0661 219/121.6 |

FOREIGN PATENT DOCUMENTS

| | | |
|---|---|---|
| JP | 2007-258738 A | 10/2007 |
| JP | 2008-147428 A | 6/2008 |
| JP | 2008-159836 A | 7/2008 |
| JP | 2013-513487 A | 4/2013 |
| KR | 10-2011-0111209 A | 10/2011 |

\* cited by examiner

Long-direction  Short-direction

METHOD OF MANUFACTURING DISPLAY APPARATUS

CROSS-REFERENCE TO RELATED APPLICATION

Korean Patent Application No. 10-2014-0146422, filed on Oct. 27, 2014, in the Korean Intellectual Property Office, and entitled: "Method of Manufacturing Display Apparatus," is incorporated by reference herein in its entirety.

BACKGROUND

1. Field

One or more embodiments relate to a method of manufacturing a display apparatus.

2. Description of the Related Art

Display apparatuses have been recently replaced with portable thin flat panel display apparatuses. From among the flat panel display apparatuses, organic light-emitting display apparatuses are self-emission display apparatuses and have a larger viewing angle, better contrast characteristics, and a faster response rate than other display apparatuses. Accordingly, the organic light-emitting display apparatuses have drawn attention as the next-generation display apparatuses. Additionally, organic light-emitting display devices having an emission layer formed of an organic material have superior brightness, driving voltage, and response time characteristics than inorganic light-emitting devices and can also realize multiple colors. These organic light-emitting display devices may be manufactured to be flexible by using a flexible plastic substrate.

SUMMARY

One or more embodiments include a method of manufacturing a display apparatus.

According to one or more embodiments, a method of manufacturing a display apparatus includes forming a flexible substrate on one surface of a carrier substrate; forming a display device on the flexible substrate; and ablating the carrier substrate by radiating a plurality of laser beams on other surface opposite the one surface of the carrier substrate, the plurality of laser beams being incident on the other surface at different angles, passing through the carrier substrate, and being overlappingly focused on a first region of a boundary surface between the carrier substrate and the flexible substrate.

In the present embodiment, the plurality of laser beams may be two to five laser beams.

In the present embodiment, the plurality of laser beams may be substantially symmetrical with respect to a plane that is perpendicular to the carrier substrate and includes the first region.

In the present embodiment, the plurality of laser beams may be four or five laser beams, and a laser beam, from among the four or five laser beams, may be incident at a largest tilt angle with respect to a line perpendicular to the carrier substrate and may form a tilt angle $\theta_1$ of 50° to 70° with respect to the line perpendicular to the carrier substrate.

In the present embodiment, a laser beam, from among the four or five laser beams, may be incident at a second largest tilt angle with respect to the line perpendicular to the carrier substrate and form a tilt angle $\theta_2$ with respect to the line perpendicular to the carrier substrate, which satisfies the equation below:

$$\theta_2 = n \cdot \tan^{-1}[d \cdot \tan\{\sin^{-1}(\sin\theta_1)/n\}/(N-1)] \qquad \text{<Equation>}$$

where n indicates a refractive index of the carrier substrate, d indicates a thickness of the carrier substrate, and N indicates the number of incident laser beams.

In the present embodiment, the plurality of laser beams may be linearly focused, and a size of the focused laser beams in a short direction may be 1.7 mm or less.

In the present embodiment, a thickness of the carrier substrate may be 0.7 mm or more.

In the present embodiment, the flexible substrate may include polyamide or polyimide.

In the present embodiment, the ablating of the carrier substrate by radiating the plurality of laser beams may be performed while moving the plurality of laser beams relative to the carrier substrate.

In the present embodiment, the ablating of the carrier substrate by radiating the plurality of laser beams may include radiating a laser beam from a single laser light source; and generating the plurality of laser beams by splitting the laser beam by using at least one beam splitter.

In the present embodiment, the single laser light source may be an excimer laser.

In the present embodiment, after the radiating of the laser beam, the ablating of the carrier substrate by radiating the plurality of laser beams may further include forming a line-shaped laser beam by passing the radiated laser beam through a beam shaping optical unit.

In the present embodiment, after the generating of the plurality of laser beams, the ablating of the carrier substrate by radiating the plurality of laser beams may further include forming a plurality of linear laser beams by passing each of the laser beams through a beam shaping optical unit.

In the present embodiment, the ablating of the carrier substrate by radiating the plurality of laser beams may include radiating a laser beam from each of a plurality of laser light sources; and forming a plurality of line-shaped laser beams by passing each of the plurality of radiated laser beams to pass through a beam shaping optical unit.

According to one or more embodiments, a laser ablation apparatus includes a stage on which a carrier substrate having one surface on which a flexible substrate and a display device are formed is disposed, and a light source unit which radiates a plurality of laser beams that pass through the carrier substrate and are then overlappingly focused on a first region on a boundary surface between the carrier substrate and the flexible substrate.

In the present embodiment, the light source unit may include one laser light source which radiates a laser beam, a beam shaping optical unit which deforms the radiated laser beam into a line-shaped laser beam, and at least one beam splitter which generates the plurality of laser beams by splitting the laser beam.

In the present embodiment, the laser ablation apparatus may further include a transfer unit which moves the stage and/or the light source unit.

In the present embodiment, the plurality of laser beams may be two to five laser beams.

In the present embodiment, the plurality of laser beams may be substantially symmetrical with respect to a plane that is perpendicular to the carrier substrate and includes the first region.

In the present embodiment, the plurality of laser beams may be four or five laser beams, and a laser beam, from among the four or five laser beams, may be incident at a largest tilt angle with respect to a line perpendicular to the carrier substrate and may form a tilt angle $\theta_1$ of 50° to 70° with respect to the line perpendicular to the carrier substrate.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
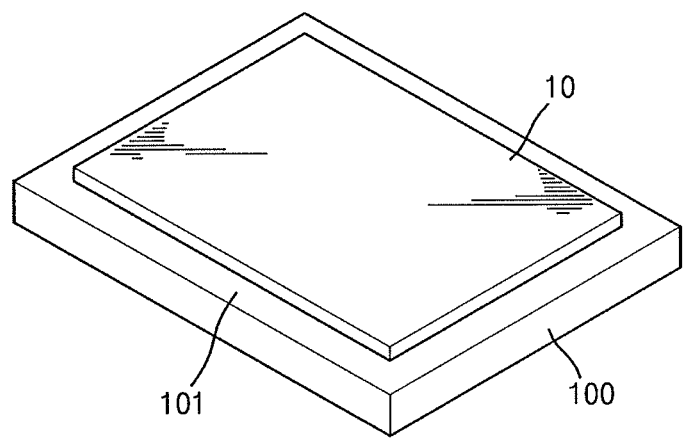
FIGS. 1-3 illustrate schematic perspective views of stages in a method of manufacturing a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

Figure 2:
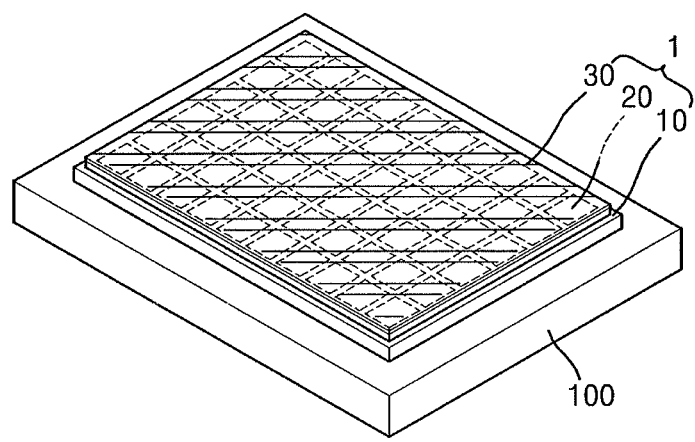
Figure 3:
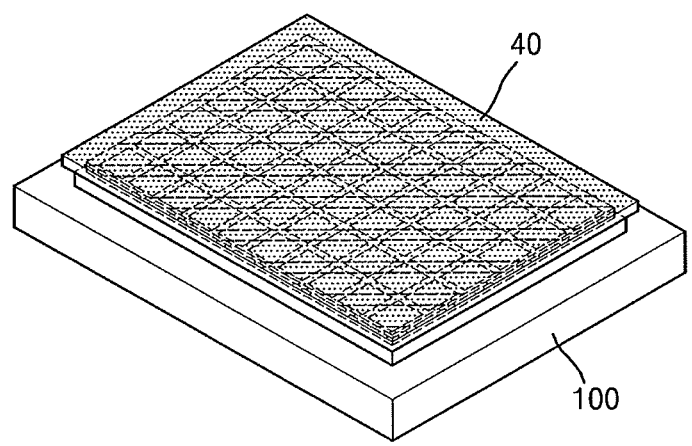
Figure 4:
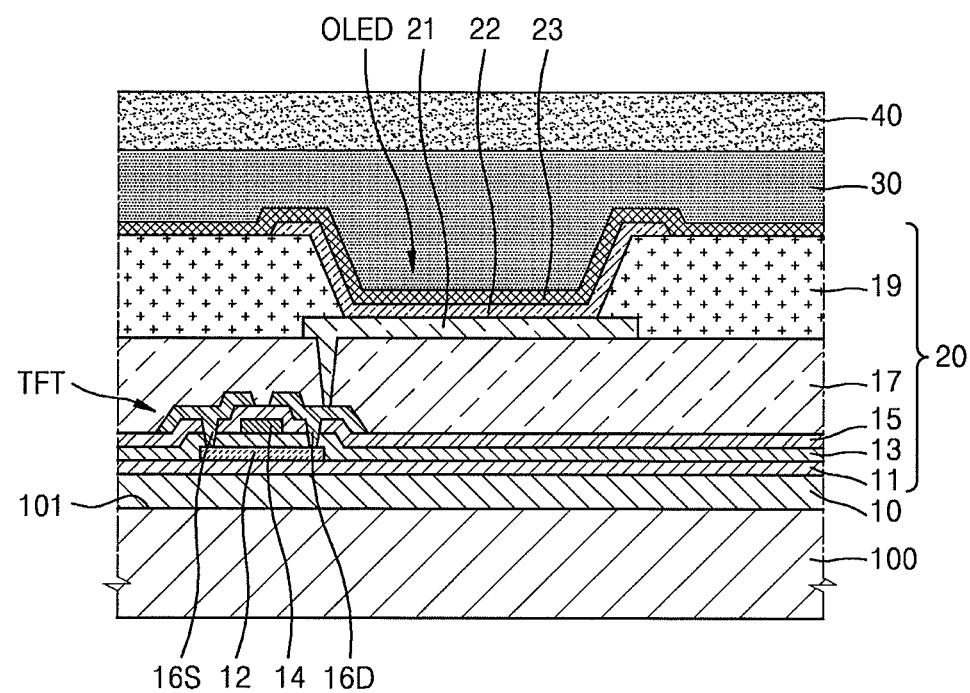
FIG. 4 illustrates a cross-sectional view of a region of the display apparatus of FIG. 3 that corresponds to one pixel.

FIGS. 1-3 are schematic perspective views of stages in a method of manufacturing a display apparatus 1 according to an embodiment. FIG. 4 is a schematic cross-sectional view illustrating a region of the display apparatus 1 of FIG. 3 that corresponds to one pixel.

Although only one thin film transistor TFT and only one organic light-emitting device OLED are illustrated in FIGS. 1-4, the display apparatus 1 may include a plurality of thin film transistors TFT and a plurality of organic light-emitting devices OLED. The display apparatus 1 further includes a capacitor, a plurality of wirings, and the like.

Referring to FIG. 1, a carrier substrate 100 is prepared, and a flexible substrate 10 is formed on a first surface 101 of the carrier substrate 100. The carrier substrate 100 is formed of a rigid material in order to function as a support while the display apparatus 1 is being manufactured. The carrier substrate 100 uses a transparent material since it is able to transmit light while being detached. For example, the carrier substrate 100 may be formed of a glass containing $SiO_2$ as a main component. In another example, the carrier substrate 100 may be formed of at least one of borosilicate glass, fused silica glass, and quartz glass.

The carrier substrate 100 may have a thickness of about 0.7 mm or more. According to an embodiment, the carrier substrate 100 may have a thickness of 0.7 mm to 1.0 mm, in contrast with substrates used, e.g., in liquid crystal displays (LCDs).

The flexible substrate 10 may be formed of a plastic material that is light and can be curved, e.g., as compared with glass substrates. For example, the flexible substrate 10 may be formed of polyamide or polyimide that has a high heat-resisting property to endure a high-temperature process, e.g., a low temperature polysilicon (LTPS) manufacturing process, and that is processed into a flexible film. For example, the flexible substrate 10 may be formed by coating an upper surface of the carrier substrate 100 with a polyamide or polyimide solution via spin coating, and then hardening the coated polyamide or polyimide solution. In another example, the flexible substrate 10 may be formed by attaching a film-type polyamide or polyimide substrate to the carrier substrate 100 by using an adhesive material, or may be formed by laminating a film-type polyamide or polyimide substrate to the carrier substrate 100.

The flexible substrate 10 may also be formed of, e.g., epoxy, polysiloxane, cellulose acetate, or a combination thereof, instead of polyamide or polyimide, or may be formed of an ultra-thin glass. The flexible substrate 10 has a thickness of about 0.3 mm or less.

Referring to FIG. 2, a display device 20 and an encapsulation film 30 are formed on the flexible substrate 10. The display device 20 may include an organic light emitting diode (OLED) and a circuit device for driving the OLED. The display device 20 is not limited to an OLED display device, and the display device 20 may include any of various display devices, e.g., a LCD and an electrophoretic display device, instead of an OLED display device.

A method of forming the display device 20 will now be described with reference to FIG. 4.

A buffer layer 11 for providing smoothness and preventing permeation of contaminants may be formed on the flexible substrate 10. The buffer layer 11 may be formed using, e.g., $SiO_2$ and/or $SiN_x$, according to any of various deposition methods, e.g., plasma enhanced chemical vapor deposition (PECVD), atmospheric pressure CVD (APCVD), and low pressure CVD (LPCVD).

A thin film transistor TFT is formed on the buffer layer 11. The thin film transistor TFT is electrically connected to an organic light-emitting device OLED to drive the organic light-emitting device OLED. Although the thin film transistor TFT is a top gate type and sequentially includes an active layer 12, a gate electrode 14, a source electrode 16S, and a drain electrode 16D in FIG. 4, embodiments are not limited thereto, and various types of thin film transistors, e.g., a bottom gate type, may be employed.

The active layer 12 is formed on the buffer layer 11. The active layer 12 may be formed of, e.g., amorphous silicon (Si), crystalline Si, an oxide semiconductor including indium (In), gallium (Ga), tin (Sn), zinc (Zn), hafnium (Hf), or the like, or an organic semiconductor.

A gate insulating layer 13 is formed on the active layer 12. The gate insulating layer 13 may be formed of an inorganic material, e.g., $SiO_2$ or $SiN_x$, in a multi-layered or single-layered structure. The gate electrode 14 is formed on a predetermined region of an upper surface of the gate insulating layer 13. The gate electrode 14 is connected to a gate line (not shown) that applies a TFT ON/OFF signal.

An interlayer insulating layer 15 is formed on the gate electrode 14, and the source electrode 16S and the drain electrode 16D are respectively electrically connected to the active layer 12 via contact holes. The thin film transistor TFT formed in this way is covered with a passivation layer 17.

The passivation layer 17 may be formed of an organic material and/or an inorganic material to have a single-layered or multi-layered structure. The organic light-emitting diode OLED is disposed on the passivation layer 17.

The organic light-emitting diode OLED includes a first electrode 21 formed on the passivation layer 17, a second electrode 23 facing the first electrode 21, and an intermediate layer 22 interposed between the first and second electrodes 21 and 23. The display apparatus 1 may be a bottom emission type, a top emission type, or a dual emission type according to light-emitting directions. When the display apparatus 1 is a bottom emission type, the first electrode 21 is a light-transmissive electrode and the second electrode 23 is a reflective electrode. When the display apparatus 1 is a top emission type, the first electrode 21 is a reflective electrode and the second electrode 23 is a semi-transmissive electrode.

When the first electrode 21 functions as an anode, the first electrode 21 may be formed of a material having a high work function, e.g., ITO, IZO, ZnO, or $In_2O_3$. The first electrode 21 may be patterned in the shape of an island corresponding to each pixel. The first electrode 21 may be electrically connected to the drain electrode 16D of the thin film transistor TFT.

A pixel definition layer (PDL) 19 covering the first electrode 21 is formed on the passivation layer 17. An opening is formed in the PDL 19, and then the intermediate layer 22, which will be described later, is formed in a region in the opening.

When the second electrode 23 functions as a cathode, the second electrode 23 may be formed of a material having a low work function, e.g., Li, Ca, LiF/Ca, LiF/Al, Al, Mg, or Ag. The second electrode 23 may be formed on the entire light-emitting area on which an image is displayed. The second electrode 23 may be connected to an external terminal (not shown) to receive power. According to an embodiment, the first electrode 21 may be a cathode and the second electrode 23 may be an anode.

The intermediate layer 22 includes at least an organic emission layer, and the intermediate layer 22 may further include at least one layer of a hole injection layer (HIL), a hole transport layer (HTL), an electron transport layer (ETL), and an electron injection layer (EIL). The intermediate layer 22 may further include various other functional layers.

When the organic light-emitting diode OLED is a full-color organic light-emitting device, the organic emission layer may be patterned into a red light-emission layer, a green light-emission layer, and a blue light-emission layer according to red sub pixels, green sub pixels, and blue sub pixels. To emit white light, the organic emission layer may have a multi-layered structure in which a red light-emission layer, a green light-emission layer, and a blue light-emission layer are stacked, or have a single-layered structure including a red light-emission material, a green light-emission material, and a blue light-emission material. An organic light-emitting diode OLED having such an organic emission layer may further include a red color filter, a green color filter, and a blue color filter to thereby emit a full color.

The organic light-emitting diode OLED may be encapsulated by the encapsulation film 30 to prevent permeation of external moisture, external air, and the like. The encapsulation film 30 may be a thin film. For example, the encapsulation film 30 may be formed by alternating a film formed of an inorganic material, e.g., silicon oxide ($SiO_x$) or $SiN_x$, with a film formed of an organic material, e.g., epoxy or polyimide. However, embodiments are not limited thereto, and the encapsulation film 30 may include a film formed of low melting glass.

Referring to FIGS. 3-4, an upper protection film 40 is formed on the encapsulation film 30. The upper protection film 40 prevents the encapsulation film 30 from being damaged while the carrier substrate 100 is being detached. The upper protection film 40 is removed after the carrier substrate 100 is detached.

When the display apparatus 1 is completed as described above, the carrier substrate 100 is detached from the display apparatus 1. The detachment of the carrier substrate 100 may include an operation of ablating the carrier substrate 100 and an operation of removing the ablated carrier substrate 100.

In the embodiment of FIGS. 1-4, after the display apparatus 1 is formed on the flexible substrate 10, the carrier substrate 100 is removed. However, embodiments are not limited thereto, and the carrier substrate 100 may be removed while the display apparatus 1 is being formed.

In the operation of ablating the carrier substrate 100, light having a certain energy density is radiated onto a boundary surface between the carrier substrate 100 and the flexible substrate 10. Then, a top surface of the flexible substrate 10 absorbs the light having a certain energy density. When the energy of the absorbed light exceeds a specific level, thermal evaporation, plasma bursting, or sonic wave generation may occur on the boundary surface, and the carrier substrate 100 may be ablated from the flexible substrate 10 by such shock waves.

Figure 5:
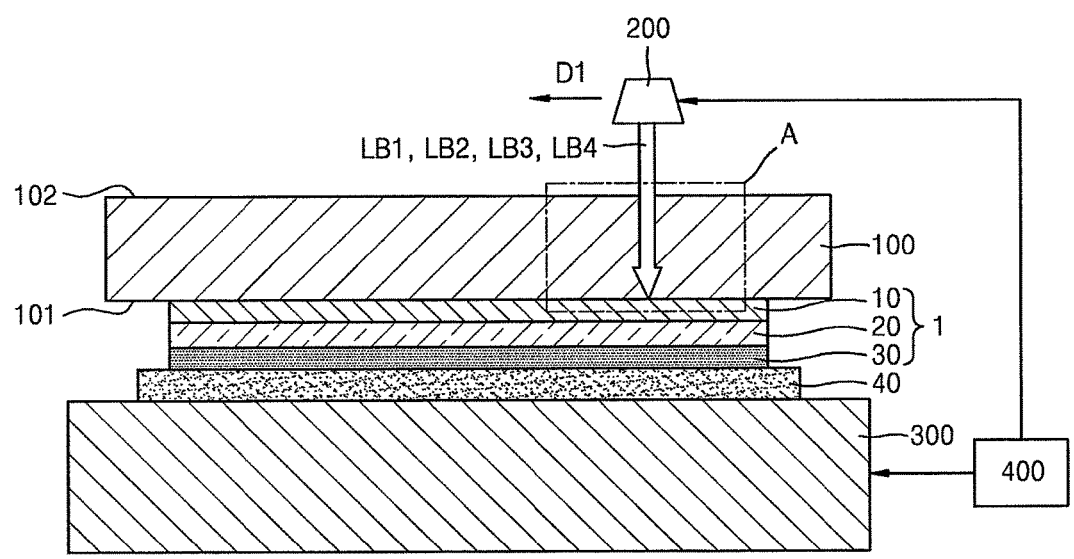
FIG. 5 illustrates a schematic diagram of a laser ablation apparatus according to an embodiment.
Figure 6:
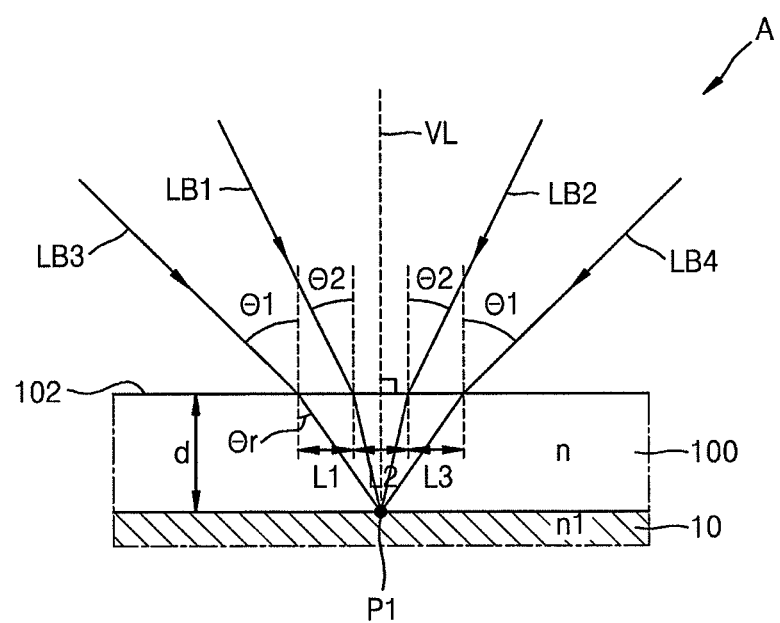
FIG. 6 illustrates a schematic cross-sectional view illustrating region A of FIG. 5, according to an embodiment.

FIG. 5 is a schematic diagram of a laser ablation apparatus according to an embodiment, and FIG. 6 is a schematic cross-sectional view illustrating a region A of FIG. 5, according to an embodiment.

Referring to FIGS. 5 and 6, the laser ablation apparatus may include a stage 300 on which the carrier substrate 100 having the first surface 101, on which the flexible substrate 10 and the display device 20 are formed, is disposed. The laser ablation apparatus may further include a light source unit 200 radiating a plurality of laser beams LB1, LB2, LB3, and LB4 toward the carrier substrate 100, so that the plurality of laser beams LB1, LB2, LB3, and LB4 pass through the carrier substrate 100 and are incident on the boundary surface between the carrier substrate 100 and the flexible substrate 10. The plurality of laser beams LB1, LB2, LB3, and LB4 overlappingly focus on the boundary surface between the carrier substrate 100 and the flexible substrate 10. For example, as illustrated in FIG. 5, even though the laser beams LB1, LB2, LB3, and LB4 may be incident on different regions of the second surface 102 of the carrier substrate 100, the laser beams LB1, LB2, LB3, and LB4 are refracted within the carrier substrate 100 to focus on a same region P1, e.g., same point P1, on the first surface 101 of the carrier substrate 100.

The stage 300 includes a flat top surface, and the display apparatus 1 to which the carrier substrate 100 has been attached may be placed on the top surface of the stage 300. At this time, the carrier substrate 100 may face the light source unit 200, and the upper protection film 40 protecting the display apparatus 1 may face the stage 300. In other words, as illustrated in FIG. 5, the upper protection film 40 is positioned directly on the stage 300, so that the carrier substrate 100 faces, e.g., directly faces, the light source unit 200.

The light source unit 200 may be moved by a transfer unit 400 in a direction D1. As the light source unit 200 moves, a laser beam may scan, e.g., point P1 may move along, the entire boundary surface between the carrier substrate 100 and the flexible substrate 10 along the length direction, i.e., direction D1, and the width direction, i.e., a direction oriented into the page in FIG. 5. However, embodiments are not limited thereto, and the transfer unit 400 may move the stage 300, instead of the light source unit 200, in a direction opposite the direction D1. In another example, the transfer unit 400 may move both the stage 300 and the light source unit 200. In other words, the plurality of laser beams LB1, LB2, LB3, and LB4 radiated by the light source unit 200 and the carrier substrate 100, including the flexible substrate 10 and the display device 20 formed thereon, may be moved relative to each other by the transfer unit 400, and accordingly, the carrier substrate 100 may be ablated from the flexible substrate 10.

According to the present embodiment, the four laser beams LB1, LB2, LB3, and LB4 may be used. The plurality of laser beams LB1, LB2, LB3, and LB4 may be incident on a second surface 102 opposite the first surface 101 of the carrier substrate 100, on which the flexible substrate 10 and the display device 20 are formed, at different tilt angles $\theta_1$, $\theta_2$, $-\theta_1$, and $-\theta_2$. The plurality of laser beams LB1, LB2, LB3, and LB4 may be focused on a first region P1 on the boundary surface between the carrier substrate 100 and the flexible substrate 10, and may overlap with each other. The plurality of laser beams LB1, LB2, LB3, and LB4 may each have a line shape when being focused, and may be substantially symmetrical about a plane that is perpendicular to the carrier substrate 100 and includes the first region P1.

In detail, referring to FIG. 6, the laser beams LB3 and LB4 incident at the tilt angle θ1, which is the largest angle with respect to a line VL perpendicular to the carrier substrate 100, from among the plurality of laser beams LB1, LB2, LB3, and LB4 may have a tilt angle $\theta_1$ of about 50° to about 70° with respect to the line VL. The laser beams LB1 and LB2 incident at the tilt angle θ2, which is the second largest with respect to the line VL perpendicular to the carrier substrate 100, may have a tilt angle $\theta_2$ satisfying Equation 1 below, with respect to the line VL:

$$\theta_2 = n \cdot \tan^{-1}[d \cdot \tan\{\sin^{-1}(\sin\theta_1)/n\}/(N-1)] \quad \text{[Equation 1]}$$

In Equation 1 above, n indicates a refractive index of a carrier substrate, d indicates a thickness of the carrier substrate, and N indicates the number of irradiated laser beams.

The ablation of the carrier substrate 100 by using laser occurs when the energy of light absorbed by the top surface of the flexible substrate 10 exceeds a specific level. When the energy of the absorbed light is too small, the carrier substrate 100 may not be detached. When it is impossible to perform a subsequent process or the undetached carrier substrate 100 is removed by force, the carrier substrate 100 may be broken or the flexible substrate 10 may be damaged. On the other hand, when the energy of the absorbed light is too large, the carrier substrate 100 may be excessively detached. When the carrier substrate 100 is excessively detached, the flexible substrate 10 may be covered with soot, and the soot may contaminate the process facilities. Moreover, the soot of the flexible substrate 10 may remain and thus cause final products to have faulty.

In other words, the carrier substrate 100 may be properly detached only when the intensity of the laser is within a certain range. That is, the carrier substrate 100 may be detached when the energy of the laser has an effective laser fluence between a minimum effective laser fluence (Fmin) and a maximum effective laser fluence (Fmax).

The effective laser fluence where the normal detachment occurs has some tolerance, and the effective fluence tolerance may be defined by $(F_{max}-F_{min})/F_{max}$. This tolerance may vary according to various factors, e.g., an absorption coefficient of the flexible substrate 10, a pulse width and frequency of a radiated laser beam, and an internal pressure of a chamber (not shown).

According to an embodiment, when the plurality of laser beams LB1, LB2, LB3, and LB4 are overlappingly focused on the first region P1 of the boundary surface between the carrier substrate 100 and the flexible substrate 10, and the intensity of the overlapped laser beams LB1, LB2, LB3, and LB4 is within a range that allows proper detachment of the carrier substrate 100, the carrier substrate 100 may be properly detached from the flexible substrate 10.

At least some of the plurality of laser beams LB1, LB2, LB3, and LB4 may be incident on the carrier substrate 100 at certain tilt angles, and the plurality of laser beams LB1, LB2, LB3, and LB4 may be refracted at different points on the second surface 102 of the carrier substrate 100 and then focused on the first region P1.

When laser ablation is performed by using a single laser beam that is perpendicularly incident on the carrier substrate 100, and a defect, e.g., particles, stains, or scratches, exists on the second surface 102 of the carrier substrate 100, this defect entirely or partially blocks the laser beam and thus prevents normal detachment of the carrier substrate 100. To remove the particles, the stains, or the scratches, at least one cleaning process is performed before the laser ablation is performed.

However, according to an embodiment, since the plurality of laser beams LB1, LB2, LB3, and LB4 are refracted at different points on the second surface 102 of the carrier substrate 100 and then focused on the first region P1, even when a defect, e.g., particles, stains, or scratches, exits on the second surface 102 of the carrier substrate 100, the carrier substrate 100 may be properly detached, and thus the cleaning process may not be performed.

Further, as discussed previously, when the defect exists on the second surface 102 of the carrier substrate 100, at least one of the plurality of laser beams LB1, LB2, LB3, and LB4 may be blocked entirely or partially by the defect. However, if the intensity of the overlapped laser beams LB1, LB2, LB3, and LB4 corresponds to the above-described effective laser fluence, the carrier substrate 100 may be properly detached.

As described above, the laser beams LB3 and LB4 incident at the tilt angle $\theta_1$, which is the largest with respect to the line VL perpendicular to the carrier substrate 100, from among the plurality of laser beams LB1, LB2, LB3, and LB4 may have a tilt angle $\theta_1$ of about 50° to about 70° with respect to the line VL. Thus, even when the second surface 102 of the carrier substrate 100 has a defect, a laser beam of a certain intensity may be incident on the first region P1 due to the laser beams LB3 and LB4 incident at relatively large tilt angles.

However, when the defect is excessively large, the laser beams may be excessively blocked. In other words, to achieve normal, e.g., proper, detachment of the carrier substrate 100, a defect having an allowable size exists, and the allowable defect size may be estimated by Equation 2 below:

$$\text{Allowable defect size} < [2d \cdot \tan \theta_r / \text{ceiling}\{(F_{max}/(F_{max}-F_{min}))-1\}] - W_p \quad \text{[Equation 2]}$$

In the above Equation 2, d indicates a thickness of the carrier substrate 100, $\theta_r$ indicates a refraction angle of an outermost laser beam incident on the carrier substrate 100, $F_{min}$ indicates a minimum effective laser fluence, $F_{max}$ indicates a maximum effective laser fluence, $W_p$ indicates a width of a laser beam projected onto the second surface 102 of the carrier substrate 100, and ceiling(x) indicates a minimum integer that exceeds x.

According to an embodiment, $(F_{max}-F_{min})/F_{max}$ may be greater than 0.25. If the thickness d of the carrier substrate 100 is 1 mm, $\theta_r$ is 40°, and $W_p$ is 0.2 mm, the allowable defect size estimated according to Equation 2, i.e., the diameter of a defect, may be less than 0.54 mm. According to an embodiment, $\theta_1$ may be about 60°, a refractive index n of the carrier substrate 100 may be about 1.5, a refractive index $n_1$ of the flexible substrate 10 may be about 1.4, $\theta_2$ may be about 23.4°, and distances $L_1$, $L_2$, and $L_3$ between the laser beams LB1, LB2, LB3, and LB4 incident on the other surface 102 of the carrier substrate 100 may be all about 0.56 mm.

Figure 7A:
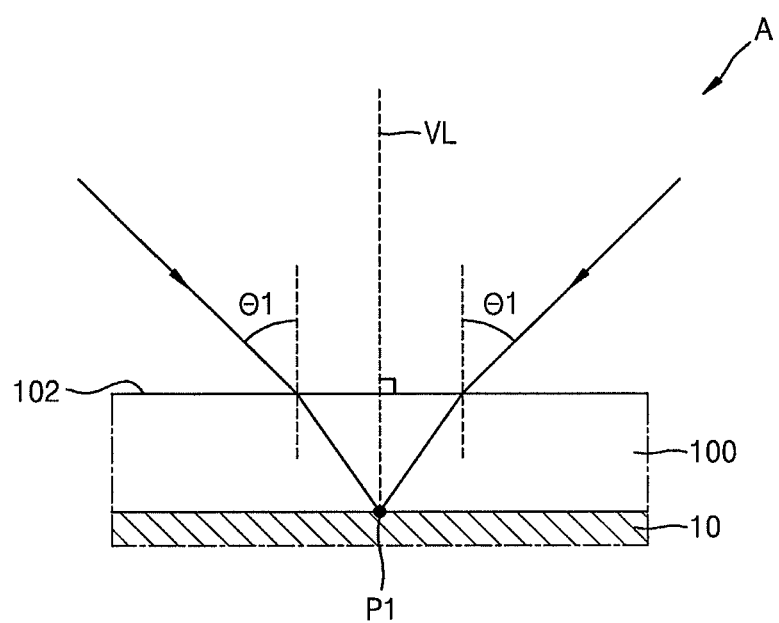
FIGS. 7A, 7B, and 7C illustrate cross-sectional views of region A of FIG. 5 according to different embodiments.
Figure 7B:
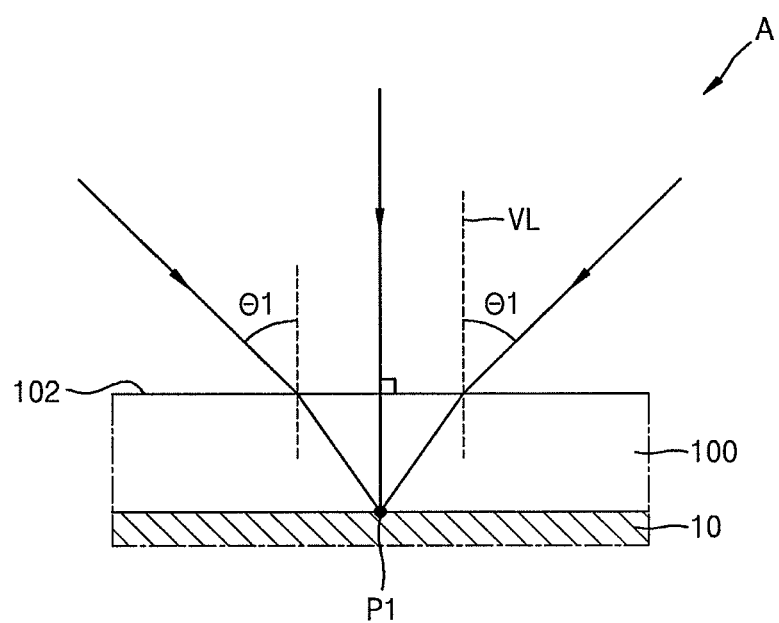
Figure 7C:
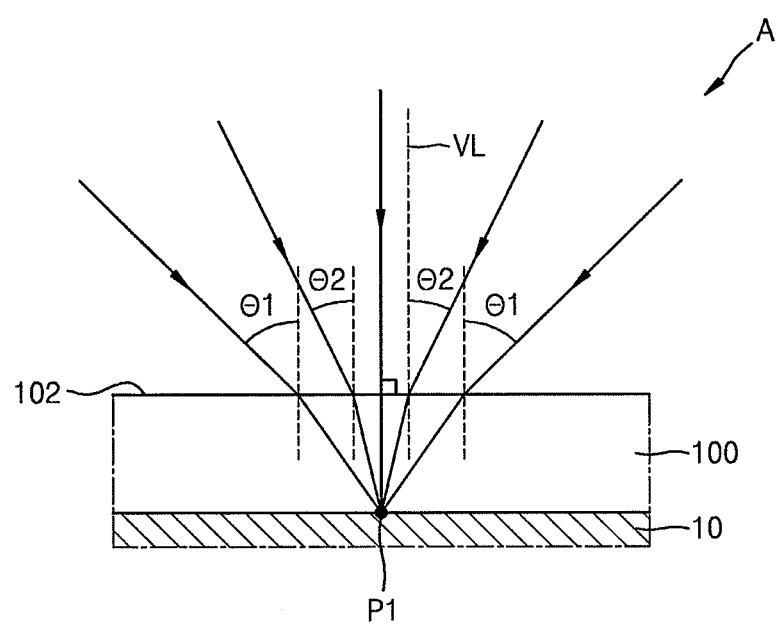

FIGS. 7A, 7B, and 7C are cross-sectional views illustrating the region A of FIG. 5 according to another embodiment.

Referring to FIG. 7A, two laser beams may be used, and the two laser beams may be incident on the second surface 102 of the carrier substrate 100 at different angles $\theta_1$ and $-\theta_1$, and may be overlappingly focused on the first region P1 of the boundary surface between the carrier substrate 100 and the flexible substrate 10. The two laser beams may each have a line shape when being focused, and may be substantially symmetrical about a plane that is perpendicular to the carrier substrate 100 and includes the first region P1.

The laser beam incident at the tilt angle $\theta_1$, which is the largest with respect to the line VL perpendicular to the carrier substrate 100, from among the two laser beams may have a tilt angle $\theta_1$ of about 50° to about 70° with respect to the line VL. In this case, $(F_{max}-F_{min})/F_{max}$ may be greater than 0.5. If the thickness d of the carrier substrate 100 is 1 mm, the allowable defect size estimated according to Equation 2, i.e., the diameter of a defect, may be less than 1.67 mm-$W_p$.

Referring to FIG. 7B, three laser beams may be used, and the three laser beams may be incident on the second surface 102 of the carrier substrate 100 at different angles 0, $\theta_1$, and $-\theta_1$ and may be overlappingly focused on the first region P1 of the boundary surface between the carrier substrate 100 and the flexible substrate 10. The three laser beams may each have a line shape when being focused, and may be substantially symmetrical about a plane that is perpendicular to the carrier substrate 100 and includes the first region P1.

The laser beam incident at the tilt angle $\theta_1$, which is the largest with respect to the line VL perpendicular to the carrier substrate 100, from among the three laser beams may have a tilt angle $\theta_1$ of about 50° to about 70° with respect to the line VL. In this case, $(F_{max}-F_{min})/F_{max}$ may be greater than 0.33. If the thickness d of the carrier substrate 100 is 1 mm, the allowable defect size estimated according to Equation 2, i.e., the diameter of a defect, may be less than 0.84 mm-$W_p$.

Referring to FIG. 7C, five laser beams may be used, and the five laser beams may be incident on the second surface 102 of the carrier substrate 100 at different angles 0, $\theta_1$, $-\theta_1$, $\theta_2$, and $-\theta_2$ and may be overlappingly focused on the first region P1 of the boundary surface between the carrier substrate 100 and the flexible substrate 10. The five laser beams may each have a line shape when being focused, and may be substantially symmetrical about a plane that is perpendicular to the carrier substrate 100 and includes the first region P1.

The laser beam incident at the tilt angle $\theta_1$, which is the largest with respect to a line VL perpendicular to the carrier substrate 100, from among the five laser beams may have a tilt angle $\theta_1$ of about 50° to about 70° with respect to the line VL. The laser beam incident at the tilt angle $\theta_2$, which is the second largest with respect to the line VL perpendicular to the carrier substrate 100, may have a tilt angle $\theta_2$ satisfying Equation 1 discussed previously.

Figure 8:
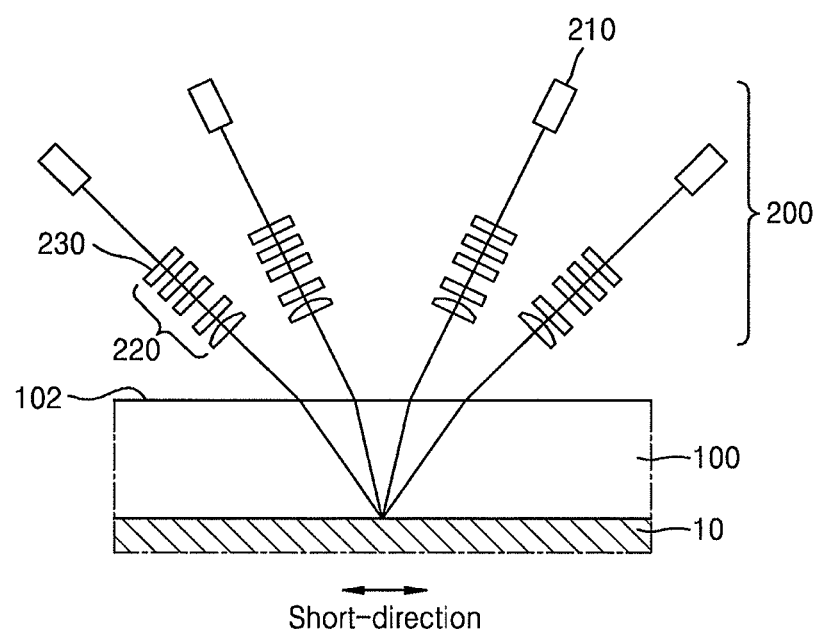
FIG. 8 illustrates a schematic diagram of a light source unit included in the laser ablation apparatus of FIG. 5.
Figure 9:
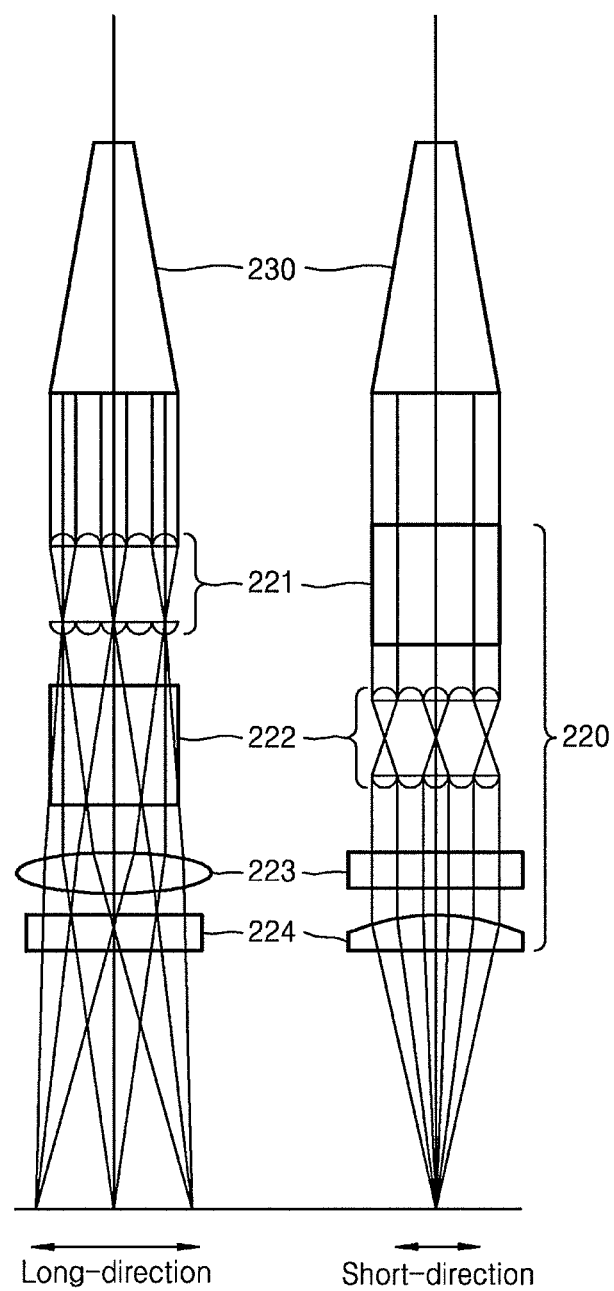
FIG. 9 illustrates a schematic diagram of a beam shaping optical unit included in the light source unit of FIG. 8.

FIG. 8 is a schematic diagram of the light source unit 200 included in the laser ablation apparatus of FIG. 5, according to an embodiment, and FIG. 9 is a schematic diagram of a beam shaping optical unit 220 included in the light source unit 200 of FIG. 8, according to an embodiment.

Referring to FIGS. 8 and 9, the light source unit 200 included in the laser ablation apparatus of FIG. 5 may include a plurality of laser light sources 210 respectively radiating a plurality of laser beams, and a plurality of beam shaping optical units 220 respectively deforming the radiated laser beams into line-shaped laser beams.

The laser light sources 210 may be excimer lasers. According to an embodiment, the laser light sources 210 may be, e.g., xenon-chloride (XeCl) excimer lasers, each emitting ultraviolet light with a wavelength of 308 nm. However, embodiments are not limited thereto, e.g., the laser light sources 210 may be various types of lasers.

Each line-shaped laser beam may have a beam shape including a short axis and a long axis and have a uniform intensity distribution. Thus, a uniform laser beam may be radiated over a large area by using the line-shaped laser beam.

The line-shaped laser beam may be obtained by any of various types of beam shaping optical units. Referring to FIG. 9, each beam shaping optical unit 220 may include first and second homogenizers 221 and 222 homogenizing an expanded laser beam obtained by an expander 230, and first and second condensers 223 and 224 focusing the homogenized laser beam.

The homogenized laser beam may be focused in a short direction, and a size of the focused laser beam in a short direction may be 1.7 mm or less. The focused laser beam may have a line shape extending in a long direction.

The beam shaping optical unit 220 may have any of various structures other than the structure of FIG. 9.

Figure 10:
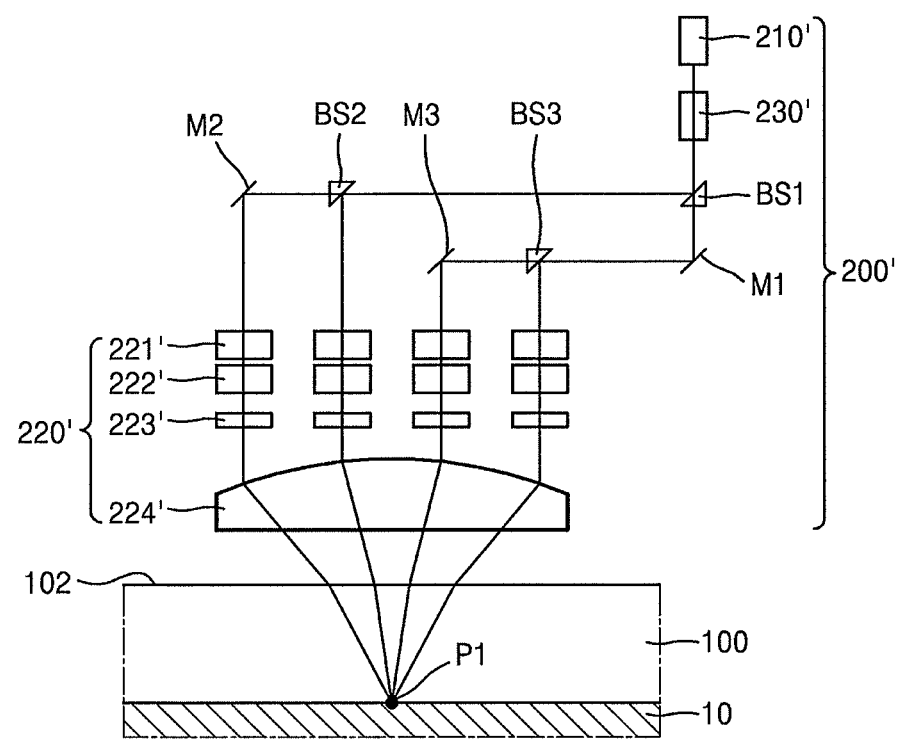
FIGS. 10 and 11 illustrate schematic diagrams of light source units included in the laser ablation apparatus of FIG. 5, according to other embodiments.
Figure 11:
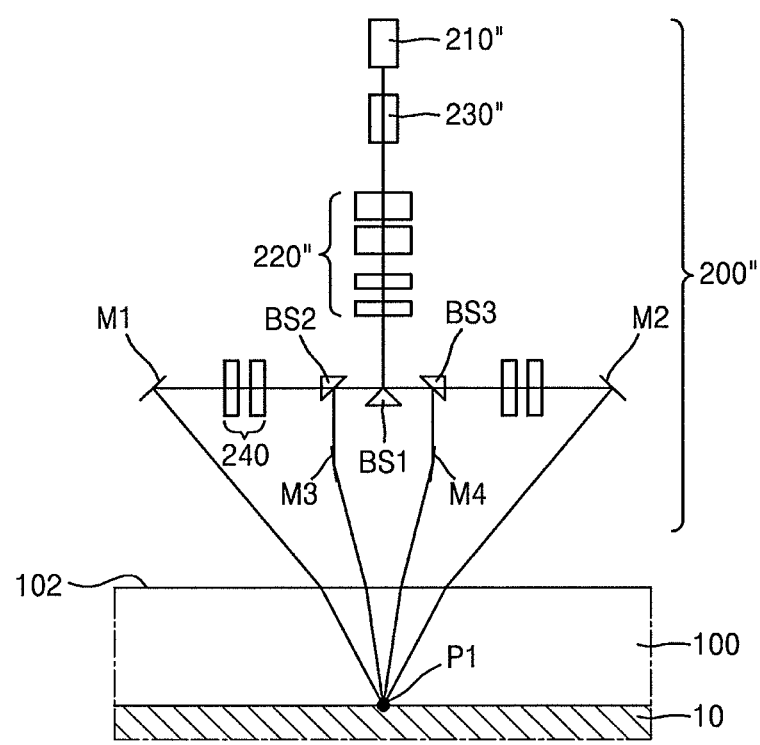

FIGS. 10 and 11 are schematic diagrams of light source units 200' and 200", each included in the laser ablation apparatus of FIG. 5, according to other embodiments.

Referring to FIG. 10, the light source unit 200' may include one laser light source 210', and beam splitters BS1, BS2, and BS3 splitting a laser beam emitted from the laser light source 210' to generate a plurality of laser beams.

Each of the beam splitters BS1, BS2, and BS3 may split an incident laser beam into two beams. Paths of the generated plurality of laser beams may be adjusted by properly arranging a plurality of mirrors M1, M2, and M3. The total number of laser beams generated due to splitting may be controlled according to how many beam splitters are disposed.

In other words, in the present embodiment, the incident laser beam is split into four laser beams by using the three beam splitters BS1, BS2, and BS3. However, embodiments are not limited thereto, and two, three, or five laser beams may be generated as illustrated in FIG. 7A, 7B, or 7C by splitting an incident laser beam by using at least one beam splitter.

Light emitted from the laser light source 210' may be expanded by an expander 230', and then may be split into a plurality of laser beams while passing through the beam splitters BS1, BS2, and BS3. The plurality of laser beams may respectively pass through a plurality of beam shaping optical units 220', and thus, line-shaped laser beams are formed.

Each beam shaping optical unit 220' may include various optical units. According to an embodiment, each beam shaping optical unit 220' may include first and second homogenizers 221' and 222' homogenizing an incident laser beam, and first and second condensers 223' and 224' focusing the homogenized laser beam.

The first and second homogenizers 221' and 222' and the first condenser 223' may be disposed on the path of each laser beam, and the second condenser 224' may be disposed such that all of the plurality of laser beams pass therethrough. The plurality of laser beams transmitted by the second condenser 224' may have line shapes, and may be focused on the first region P1 of the boundary surface between the carrier substrate 100 and the flexible substrate 10 in order to ablate the carrier substrate 100 from the flexible substrate 10.

Referring to FIG. 11, the light source unit 200" may include one laser light source 210", an expander 230" expanding a laser beam emitted from the laser light source 210", a beam shaping optical unit 220" deforming an expanded laser beam obtained by the expander 230" into a line-shaped laser beam, and beam splitters BS1, BS2, and BS3 splitting the line-shaped laser beam transmitted by the beam shaping optical unit 220" to generate a plurality of laser beams. Each of the beam splitters BS1, BS2, and BS3 may split an incident laser beam into two beams. Paths of the generated plurality of laser beams may be adjusted by properly arranging a plurality of mirrors M1, M2, M3, and M4.

According to an embodiment, since the linear laser beam is formed using the single beam shaping optical unit 220', and is then split using the beam splitters BS1, BS2, and BS3, the optical device may be minimized, e.g., have a reduced size as compared to an optical device having the light source unit 200'.

A laser beam focusing unit 240 may be further disposed on the path of at least one selected from the plurality of laser beams into which the line-shaped laser beam is split by the beam splitters BS1, BS2, and BS3.

The plurality of laser beams may have line shapes and may be focused on the first region P1 of the boundary surface between the carrier substrate 100 and the flexible substrate 10 in order to ablate the carrier substrate 100 from the flexible substrate 10.

Figure 12:
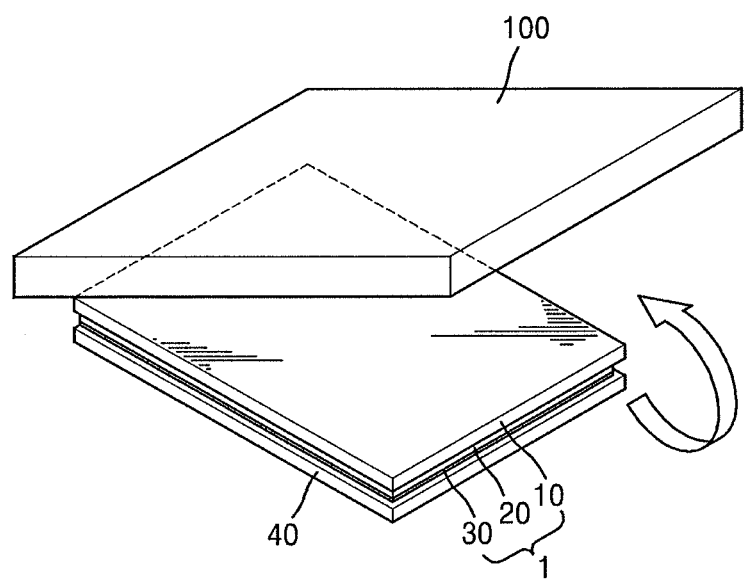
FIGS. 12 and 13 illustrate schematic perspective views of further stages in the method of manufacturing the display apparatus in FIGS. 1-3.
Figure 13:
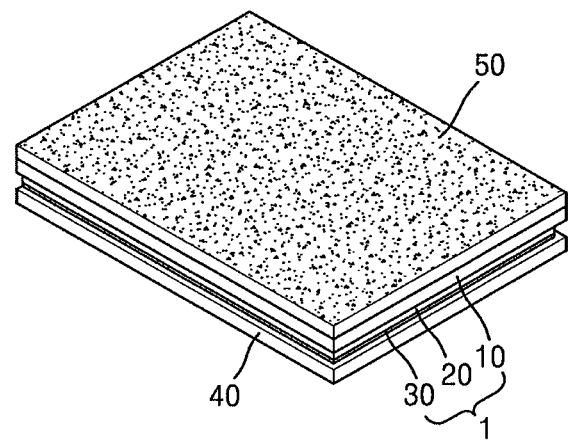

FIGS. 12 and 13 are schematic perspective views for further explaining a method of manufacturing a display apparatus, according to an embodiment, in conjunction with FIGS. 1-3.

Referring to FIG. 12, after the ablation of the carrier substrate 100 is completed, the carrier substrate 100 is removed. When normal detachment is performed, the carrier substrate 100 is easily removed, the state of the surface of the flexible substrate 10 from which the carrier substrate 100 has been removed is uniform, and no soot remains.

Referring to FIG. 13, a lower protection film 50 is attached to the exposed flexible substrate 10. The lower protection film 50 prevents damage of the flexible substrate 10 similar to the upper protection film 40 and supports the display apparatus 1 so that the display apparatus 1 may be easily transported. The lower protection film 50 and the upper protection film 40 are types of releasing films, and may be removed later.

By way of summation and review, the flexibility of the flexible plastic substrate of the flat panel display device requires a rigid support during the manufacturing process thereof. Thus, after a flexible substrate is formed on a rigid carrier substrate, e.g., formed of glass, and the flat panel display device is manufactured, the carrier substrate should be removed.

Therefore, as described above, example embodiments provide a laser ablation apparatus and a method of manufacturing a display apparatus by using the laser ablation apparatus. That is, even when the carrier substrate has a defect, e.g., particles, stains, or scratches, the carrier substrate may be properly ablated using a plurality of laser beams, without performing a cleaning process for removing the defect. In other words, blocking of the laser light by a defect on the carrier substrate, e.g., particles, stains, or scratches on the carrier substrate, may prevented or substantially minimized. As such, proper removal of carrier substrates may be improved, and the manufacturing yield of display apparatuses may be increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a display apparatus, the method comprising:
    forming a flexible substrate on a first surface of a carrier substrate;
    forming a display device on the flexible substrate; and
    ablating the carrier substrate by radiating a plurality of laser beams on a second surface of the carrier substrate, the second surface being opposite the first surface, such that the plurality of laser beams is incident on the second surface at different angles, passes through the carrier substrate, and is overlappingly focused on a first region of a boundary surface between the carrier substrate and the flexible substrate, wherein the plurality of laser beams includes four or five laser beams, and at least one laser beam, among the four or five laser beams, is incident at a largest tilt angle with respect to a line perpendicular to the carrier substrate and forms a tilt angle $\theta_1$ of about 50° to about 70° with respect to the line perpendicular to the carrier substrate, and wherein at least one laser beam, among the four or five laser beams, is incident at a second largest tilt angle with respect to the line perpendicular to the carrier substrate and forms a tilt angle $\theta_2$ with respect to the line perpendicular to the carrier substrate, the tilt angle $\theta_2$ satisfying the equation below:

$$\theta_2 = n \cdot \tan^{-1}[d \cdot \tan\{\sin^{-1}(\sin\theta_1)/n\}/(N-1)]$$

wherein n indicates a refractive index of the carrier substrate, d indicates a thickness of the carrier substrate, and N indicates the number of incident laser beams.

2. The method as claimed in claim 1, wherein the plurality of laser beams is symmetrical with respect to a plane that is perpendicular to the carrier substrate and includes the first region.

3. The method as claimed in claim 1, wherein the plurality of laser beams is linearly focused, a size of the focused laser beams in a short direction being about 1.7 mm or less.

4. The method as claimed in claim 1, wherein a thickness of the carrier substrate is about 0.7 mm or more.

5. The method as claimed in claim 1, wherein the flexible substrate is formed of polyamide or polyimide.

6. The method as claimed in claim 1, wherein ablating the carrier substrate by radiating the plurality of laser beams is performed while moving the plurality of laser beams relative to the carrier substrate.

7. The method as claimed in claim 1, wherein ablating the carrier substrate by radiating the plurality of laser beams includes:

radiating a laser beam from a single laser light source; and
generating the plurality of laser beams by splitting the laser beam by using at least one beam splitter.

8. The method as claimed in claim 7, wherein the single laser light source is an excimer laser.

9. The method as claimed in claim 7, wherein, after radiating the laser beam, ablating the carrier substrate by radiating the plurality of laser beams further comprises forming a line-shaped laser beam by passing the radiated laser beam through a beam shaping optical unit.

10. The method as claimed in claim 7, wherein, after generating the plurality of laser beams, ablating the carrier substrate by radiating the plurality of laser beams further comprises forming a plurality of linear laser beams by passing each of the laser beams through a beam shaping optical unit.

11. The method as claimed in claim 1, wherein ablating the carrier substrate by radiating the plurality of laser beams includes:

radiating a laser beam from each of a plurality of laser light sources; and
forming a plurality of line-shaped laser beams by passing each of the plurality of radiated laser beams through a beam shaping optical unit.

12. The method as claimed in claim 1, wherein:
the plurality of laser beams pass through the carrier substrate at respective angles of refraction, and
each of the plurality of laser beams is focused on the first region based on a relationship between the angle of refraction of each of the plurality of laser beams and an incident angle relative to the second surface of the carrier substrate.

13. The method as claimed in claim 1, wherein:
the plurality of laser beams are incident on respective points on the second surface of the carrier substrate, and
distances between adjacent ones of the respective points are about equal.

* * * * *